United States Patent
Le Dortz et al.

(10) Patent No.: US 9,608,653 B2
(45) Date of Patent: Mar. 28, 2017

(54) METHOD AND DEVICE FOR COMPENSATING BANDWIDTH MISMATCHES OF TIME INTERLEAVED ANALOG TO DIGITAL CONVERTERS

(71) Applicant: STMicroelectronics S.A., Montrouge (FR)

(72) Inventors: Nicolas Le Dortz, Grenoble (FR); Thierry Simon, Grenoble (FR); Pascal Urard, Theys (FR); Caroline Lelandais-Perrault, Gif sur Yvette (FR); Rakhel Kumar Parida, Edinburgh (GB)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/039,184

(22) PCT Filed: Nov. 21, 2014

(86) PCT No.: PCT/EP2014/075267
§ 371 (c)(1),
(2) Date: May 25, 2016

(87) PCT Pub. No.: WO2015/082233
PCT Pub. Date: Jun. 11, 2015

(65) Prior Publication Data
US 2017/0026052 A1   Jan. 26, 2017

(30) Foreign Application Priority Data
Dec. 4, 2013  (FR) ..................... 13 62091

(51) Int. Cl.
*H03M 1/06* (2006.01)
*H03M 1/12* (2006.01)

(52) U.S. Cl.
CPC ....... *H03M 1/0617* (2013.01); *H03M 1/0626* (2013.01); *H03M 1/1215* (2013.01); *H03M 1/1245* (2013.01)

(58) Field of Classification Search
CPC .. H03M 1/1215; H03M 1/121; H03M 1/1245; H03M 1/0626; H03M 1/0836;
(Continued)

(56) References Cited

U.S. PATENT DOCUMENTS 7,782,235 B1 *  8/2010  Velazquez ........... H03M 1/1004
                                                                 341/118
7,916,050 B1 *  3/2011  Mujica .................. H03M 1/1004
                                                                 341/118
(Continued)

OTHER PUBLICATIONS

Ghanem, F. et al., "A Background Extraction Technique for Bandwidth Mismatch Error in a Two-Channel Time-Interleaved ADC," IEEE 10th International New Circuits and Systems Conference (NEWCAS), Jun. 17, 2012, pp. 353-356.
(Continued)

*Primary Examiner* — Linh Nguyen
(74) *Attorney, Agent, or Firm* — Slater Matsil, LLP

(57) ABSTRACT

A device can be used for compensating bandwidth mismatches of time interleaved analog to digital converters. A processor of the device determines, for each original sample stream, an estimated difference between the time constant of a low pass filter representative of the corresponding converter and a reference time constant of a reference low pass filter, and uses this estimated difference and a filtered stream to correct the original stream and deliver a corrected stream of corrected samples.

20 Claims, 6 Drawing Sheets

(58) Field of Classification Search
CPC .... H03M 1/12; H03M 1/1061; H03M 1/1038; H03M 1/1009; H03M 1/1042; H03M 1/1023; H03M 1/1057; H03M 1/1205; H03M 3/434
USPC .......... 341/118–121, 141, 142, 155
See application file for complete search history.

(56) References Cited

U.S. PATENT DOCUMENTS

| | | | |
|---|---|---|---|
| 7,916,051 B1* | 3/2011 | Sestok | H03M 1/1061 341/120 |
| 8,094,050 B2 | 1/2012 | Sestok | |
| 8,749,410 B1* | 6/2014 | Van Der Goes | H03M 1/1057 341/118 |
| 8,890,739 B2* | 11/2014 | Lewis | H03M 1/1061 341/118 |
| 2007/0262895 A1* | 11/2007 | Stein | H03M 1/0626 341/155 |
| 2010/0192027 A1 | 7/2010 | Johansson | |
| 2011/0234435 A1* | 9/2011 | Woodward | G02F 7/00 341/137 |
| 2013/0015990 A1 | 1/2013 | Payne | |
| 2013/0141261 A1 | 6/2013 | Johancsik | |
| 2014/0009318 A1* | 1/2014 | Taluja | H03M 1/50 341/118 |
| 2015/0263749 A1* | 9/2015 | Ramakrishnan | H03M 1/06 341/120 |
| 2015/0303934 A1* | 10/2015 | Chiu | H03M 1/1009 341/120 |
| 2016/0079994 A1* | 3/2016 | Lee | H03M 1/002 341/118 |
| 2016/0149582 A1* | 5/2016 | Ragab | H03M 1/0626 341/120 |

OTHER PUBLICATIONS

Saleem, S. et al., "Adaptive Blind Background Calibration of Polynomial-Represented Frequency Response Mismatches in a Two-Channel Time-Interleaved ADC," IEEE Transactions on Circuits and Systems I: Regular Papers, vol. 58, No. 6, Jun. 2011, pp. 1300-1310.

Tsai, T-H. et al., "Bandwidth Mismatch and Its Correction in Time-Interleaved Analog-to-Digital Converters," IEEE Transactions on Circuits and Systems II: Express Briefs, vol. 53, No. 10, Oct. 2006, pp. 1133-1137.

* cited by examiner before compensation after compensation

METHOD AND DEVICE FOR COMPENSATING BANDWIDTH MISMATCHES OF TIME INTERLEAVED ANALOG TO DIGITAL CONVERTERS

This is a national stage filing under section 371 of PCT/EP2014/075267 filed Nov. 21, 2014, which claims the benefit of French Application No. 1362091, filed on Dec. 4, 2013, which application is hereby incorporated herein by reference.

TECHNICAL FIELD

Embodiments of the invention are related to a method and device for compensating bandwidth mismatches of time interleaved analog-to-digital converters.

BACKGROUND

Certain present-day applications require analog-to-digital converters having a high sampling frequency and a high resolution. Among these applications are cable TV transmissions, optical communications and satellite communications in which one or more modulated signals are transmitted simultaneously on a wide frequency band (for example several GHz wide).

Moreover, the use of increasingly complex modulations requires a digitizing of the signals using a large number of bits.

Single-converter architectures have difficulty in meeting the required performance levels at an acceptable cost in terms of consumption and of space requirement.

Moreover, structures having several time-interleaved analog-to digital converters (TIADCs: Time-Interleaved Analog to Digital Converters) are being imposed in order to meet this requirement. In such a time-interleaved structure, the time-interleaved analog-to-digital converters respectively carry out time-shifted analog-to-digital conversions of an analog signal. In other words, if the structure comprises M converters, the latter successively sample, each in their turn, the signal at a frequency equal to Fs/M, where Fs is the overall sampling frequency of the structure.

However, the disadvantage of this type of structure is that mismatches, even slight, between the converters create parasitic lines or frequency bands that can be situated in the frequency zone of the useful signal. Moreover, in the case, for example, of television signals containing several channels, these parasitic bands or lines can interfere with some of these channels.

These mismatches can have various causes, such as for example timing skews and possibly static gains and/or offsets that are different between the converters of the structure.

Another cause of mismatch is the inequality between the values of the bandwidths of the different converters of the structure.

It is in fact known to those skilled in the art, for example from the article by Tsung-Heng Tsai and others entitiled "Bandwidth Mismatch and its Correction in Time-Interleaved Analog-to-Digital Converters," IEEE Transactions on Circuits and Systems—II: Express Briefs, vol. 53, no. 10, October 2006, that an analog-to-digital converter can be represented in the first order by a first order low-pass filter and by an ideal sampler. The bandwidth of the converter is then defined by the cut-off frequency or the time constant of this first order low-pass filter. It is then said that there is bandwidth mismatch of the different converters of the structure when the different cut-off frequencies or different time constants of the different first order low-pass filters are different.

In practice, the cut-off frequency of these filters is high, typically of the order of one GHz or of about ten GHz, in order to prevent a cutting off of the useful signal. Such a difference in cut-off frequencies causes frequency bands or parasitic tones in the sampled signal. Moreover, as the input signal becomes higher and close to the cut-off frequency of the filters, the power of the parasitic frequency bands becomes greater with respect to the useful signal. This is particularly critical for analog input signals having high frequencies, typically of the order of a few tens of GHz, such as those found for example in optical communications.

The abovementioned article proposes a solution for correcting the bandwidth mismatch based on the hypothesis that the different time constants of the low-pass filters of the converters are already known, which is a limited solution.

The article by Shahzad Saleem and others, entitled "Adaptative Blind Background Calibration of Polynomial-Represented Frequency Response Mismatches in a Two-Channel Time-Interleaved ADC," IEEE Transactions on Circuits and Systems—I: Regular Papers, vol. 58, no. 6, June 2011, deals with bandwidth mismatches of any order greater than or equal to 1.

In this second article, the solution described for dealing with these mismatches is valid only for an input signal having strict constraints in terms of frequency spectrum and bandwidth. The frequency spectrum must thus notably exhibit "holes" and the proposed solution aims to minimize the power of the parasitic frequency noise, appearing in these holes because of the mismatches, by way of iterative and retroactive corrections (that is to say carried out upstream of the converters). Here again, such a solution is limited and is moreover complex.

SUMMARY

Embodiments of the invention notably but not exclusively apply to the correction of the mismatch between the different bandwidths of several so called "time-interleaved" analog-to-digital converters, that is to say respectively carrying out time-shifted analog-to-digital conversions of an analog signal in order to increase the overall sampling frequency.

Embodiments of the invention relate to the processing of a sampled signal and, more particularly, the correction of that sampled signal notably in order to correct the bandwidth mismatch of several analog-to-digital converters of an analog-to-digital conversion system delivering that sampled signal.

According to one implementation and embodiment, it is proposed to compensate for the bandwidth mismatch of a structure of time-interleaved converters in a "forward" manner, that is to say without retroactive correction of the samples to be corrected based on information situated downstream of the point of reception of those samples, and to do so in a single iteration, that is to say without a feedback loop, and therefore without risk of divergence, and in a "blind" manner, that is to say by acting on the signal actually delivered by the converters, whatever that signal may be, without it being necessary to provide a calibration phase using a known signal at the input of the converters.

According to one aspect, there is proposed a method of direct compensation of the bandwidth mismatch of M time-interleaved converters respectively delivering M original trains of M original samples, M being greater than two, each converter being considered in the first order as comprising a first order low-pass filter. The method comprises a process of digital filtering of the M original trains delivering M filtered trains of filtered samples. This filtering has a transfer function substantially equal to the product of the transfer function of a reference low-pass filter and the transfer function of a derivative filter multiplied by the reference time constant of the reference low-pass filter and, for each original train of original samples.

An estimation process delivers an estimated difference between the time constant of the first order low-pass filter associated with the corresponding converter and the reference time constant, preferably normalized by the reference time constant, and comprising a first generation of a first item of differentiated power information relative to the original train and a second generation of a second item of information of differentiated power relative to at least one of the M filtered trains.

A process of correction of the original samples of the original train uses the filtered samples of the corresponding filtered train and the corresponding estimated difference, in such a way as to deliver a corrected train of corrected samples. The M corrected trains are then considered as coming from the corresponding M converters, the first order low-pass filters of which all have the reference time constant as their time constant.

The method according to this first aspect thus makes it possible to carry out the compensation of bandwidths of the converters, and notably the estimation of the differences of time constants, in a direct (forward) manner, that is to say without retroactive correction of the original samples from an item of information located downstream of the point of reception of the original samples to be corrected. This therefore requires only a single iteration, that it to say no feedback loop and without risk of divergence or any necessity of providing a calibration phase. Because of this, the hardware embodiment is thereby simplified and the estimation of the mismatch is faster.

The term "compensation" must of course be understood to be a compensation that is not necessarily perfect because, in practice, the correction can result in low-pass filters all having the reference time constant to within an estimation error.

Moreover, the concept of "differentiated" power information signifies that in fact this differentiated power information comprises two different power indications associated with the same train, which will make it possible to eliminate the static gain of the corresponding converter in the determination of the estimated difference between the time constant of the first order low-pass filter associated with this converter and the reference time constant.

According to one implementation, the process of filtering comprises a filtering of the original trains of original samples by a digital filter, for example a finite impulse response filter, the transfer function of which is substantially equal to $j\omega\tau_{ref}/(1+j\omega\tau_{ref})$, in which $\tau_{ref}$ denotes the time constant of the first order reference low-pass filter.

According to one implementation, the first generation comprises a first filtering of the corresponding original train with a first filter and a determination of a first indication of power of the original train filtered by this first filter, and a second filtering of the corresponding original train within a second filter, different from the first filter, and a determination of a second indication of power of the original train filtered by this second filter, the first differentiated power information comprising the first and second power indications, and the second generation comprises a third filtering of the at least one of the M trains filtered with the first filter and a determination of a third indication of power of the at least one of the M filtered trains filtered by this first filter, and a fourth filtering of the at least one of the M trains filtered with the second filter and a determination of a fourth indication of power of the at least one of the M filtered trains filtered by this second filter, the second differentiated power information comprising the third and fourth power indications.

This second differentiated power information could, as a variant, be an item of averaged power information obtained for example by averaging the third and fourth power indications associated with some or all of the filtered trains.

According to one implementation, the process of estimation furthermore comprises a determination of a first averaged power indication obtained by an average of the M first power indications and a determination of a second averaged power indication obtained by an average of the M second power indications, and the estimated difference is obtained for the corresponding original train from the first corresponding power indication, from the second corresponding power indication, from the third power indication, from the fourth power indication, from the first averaged power indication and from the second averaged power indication.

According to one implementation, the correction process comprises, for each original train, an addition to each original sample of the product of the homologous filtered sample of the filtered train corresponding to this original train and the corresponding estimated difference.

According to another aspect, a device can be used for the direct compensation of the bandwidth mismatch of M time-interleaved converters, M being greater than two, each converter is considered in the first order as comprising a first order low-pass filter. An input receives M original trains of original samples respectively coming from the M converters. Output delivers M corrected trains of corrected samples. A processor comprises a digital filter configured to carry out a filtering process on the M original trains in such a way as to deliver M corresponding filtered trains of filtered samples. This filter has a transfer function substantially equal to the product of the transfer function of a reference low-pass filter and the transfer function of a derivative filter multiplied by the reference time constant of the reference low-pass filter.

An estimator is configured to carry out an estimation process delivering, for each original train, an estimated difference between the time constant of the first order low-pass filter associated with the corresponding converter and the reference time constant, preferably normalized by the reference constant, and comprising a first generation of a first item of differential differentiated power information relative to each original train and a second generation of a second item of differentiated power information relative to at least one of the M filtered trains. A correction circuit is configured to carry out a process of correction of the original samples of each original train using the filtered samples of the corresponding filtered trains and the corresponding estimated difference, in such a way as to deliver a corresponding corrected train of corrected samples, the M corrected trains then being considered as having come from the corresponding M converters, the first order low-pass filters of which all have the reference time constant as their time constant.

According to one embodiment, the filter comprises a filter whose transfer function is substantially equal to $j\omega\tau_{ref}/(1+j\omega\tau_{ref})$, where $\tau_{ref}$ denotes the time constant of the reference first order low-pass filter.

This filter can for example be a finite impulse response filter.

According to one embodiment, the estimator comprises a first stage comprising a first filter intended to filter the corresponding original train and a first module configured to determine a first power indication of the original train filtered by the first filter, and a second filter, different from the first filter, intended to filter the corresponding original train and a second module configured to determine a second power indication of the original train filtered by the second filter. The first differentiated power information comprises the first and second power indications. A second stage comprises the first filter intended to filter the at least one of the M filtered trains. A third module is configured to determine a third power indication of the at least one of the M filtered trains filtered by the first filter. The second filter is intended to filter the at least one of the M filtered trains. A fourth module is configured to determine a fourth power indication of the at least one of the M filtered trains filtered by this second filter. The second differentiated power information comprises the third and fourth power indications.

According to one embodiment, the estimator comprises a third stage configured to determine a first averaged power indication obtained by an average of the M first power indications and a second averaged power indication obtained by an average of the M second power indications. The estimator also comprises a calculator configured to calculate the estimated difference for the corresponding original train, from the corresponding first power indication, from the second corresponding power indication, from the third power indication, from the fourth power indication, from the first averaged power indication and from the second averaged power indication.

According to one embodiment, the correction circuit is configured, for each original train, to add to each original sample the product of the homologous filtered sample of the filtered train corresponding to this original train and the corresponding estimated difference.

According to another aspect, there is proposed an integrated circuit comprising a compensation device such as defined above.

BRIEF DESCRIPTION OF THE DRAWINGS

Other advantages and features of the invention will become apparent on examination of the detailed description of implementations and embodiments, that are in no way limiting, and of the appended drawings in which.

DETAILED DESCRIPTION OF ILLUSTRATIVE EMBODIMENTS

Figure 1:
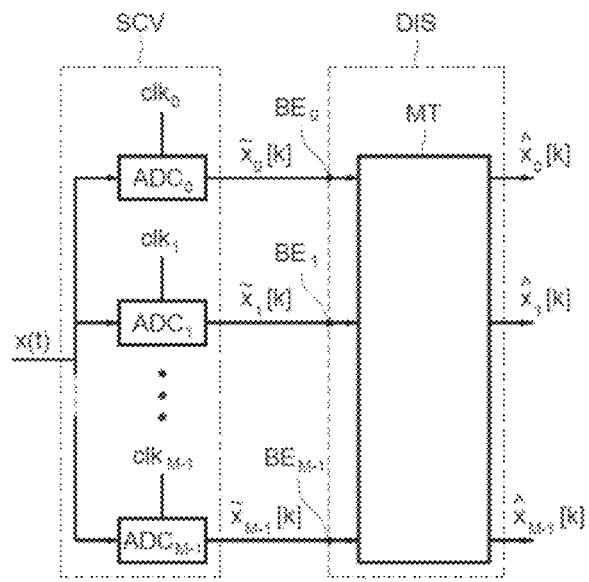
FIGS. 1 to 11 show different implementations and embodiments of a method and of a device according to the invention.

In FIG. 1, the reference SCV denotes a system or structure for the analog-to-digital conversion of an analog signal x(t). In the example described here, the analog-to-digital conversion system is a time-interleaved one comprising several time-interleaved analog-to-digital converters (in this case M analog-to-digital converters) $ADC_0$-$ADC_{M-1}$.

The analog-to-digital converter $ADC_m$ is controlled by the clock signal $clk_m$.

Figure 2:
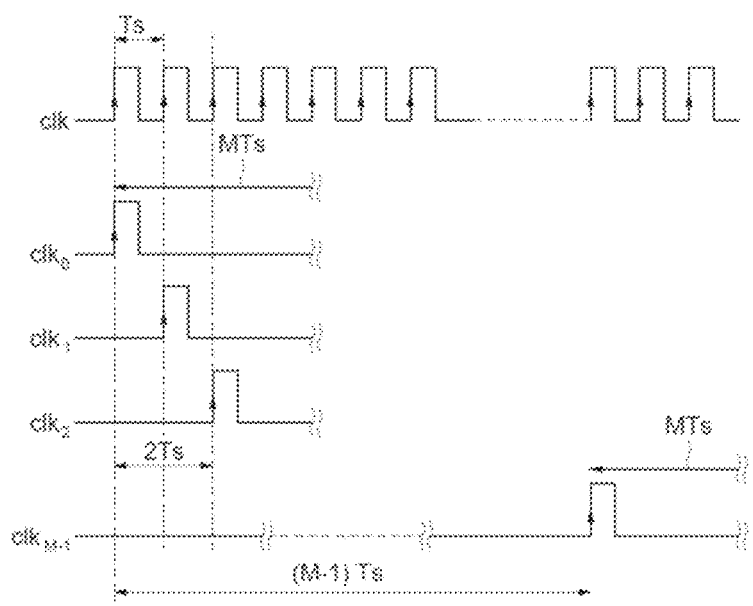

As shown more particularly in FIG. 2, the frequency of the clock signal $clk_m$, is equal to Fs/M where Fs denotes the actual frequency At which the analog signal x(t) is sampled. Fs can typically be equal to several GHz or to several tens of GHz. The period of each clock signal $clk_m$ is equal to MTs, where Ts denotes the period of the clock signal clk having Fs as its frequency. Moreover, the sampling of the analog signal x(t) is carried out in parallel and, in this FIG. 2 which illustrates a perfect theoretical case, each converter $ADC_m$ samples the same analog signal with a time shift equal to Ts with respect to the preceding converter.

In this embodiment, each converter $ADC_m$ delivers an original train of original samples $\tilde{x}_m[k]$.

Figure 3:
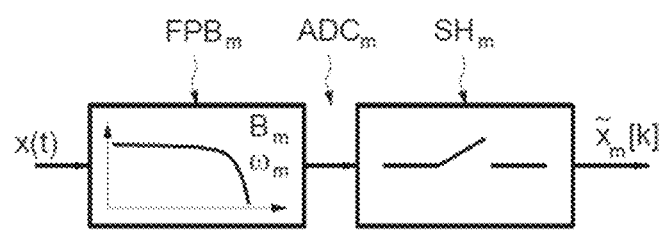

As shown diagrammatically in FIG. 3, each converter $ADC_m$ can be considered in the first order as a first order low-pass filter $FPB_m$ followed by an ideal sampler $SH_m$.

The transfer function $B_m(\omega)$ of the low-pass filter $FPB_m$ is defined by the following formula (1):

$$B_m(\omega) = \frac{1}{1 + j\omega/\omega_m} \qquad (1)$$

in which $\omega_m$ denotes the cut-off pulsatance of the filter.

The time constant $\tau_m$ of the filter is equal to $1/\omega_m$.

The M analog-to-digital converters of the conversion system SCV do not generally all have the same time constant and consequently the same bandwidth. This mismatch of bandwidths, or of time constants, adds parasitic frequency bands to the frequency spectrum of the output signal.

There is therefore proposed a method for processing the sampled signal, the purpose of which is to compensate for this bandwidth or time constant mismatch.

This processing method is used within a processing device DIS the M input terminals $BE_0$-$BE_{M-1}$ of which receive the M trains of samples $\tilde{x}_m[k]$, where m varies from 0 to M−1.

In this respect, the device DIS comprises processor MT, which delivers at its output corrected trains of corrected samples $\hat{x}_m[k]$, where m varies from 0 to M−1.

Moreover, these M corrected trains are then considered as having come from the corresponding M converters the first order low-pass filters of which all have the same time constant which, as will be seen in more detail below, is a reference time constant of a reference first order low-pass filter.

Reference will now be made more particularly to FIGS. 4 to 9, in order to illustrate a version of embodiment of the processor MT.

Figure 4:
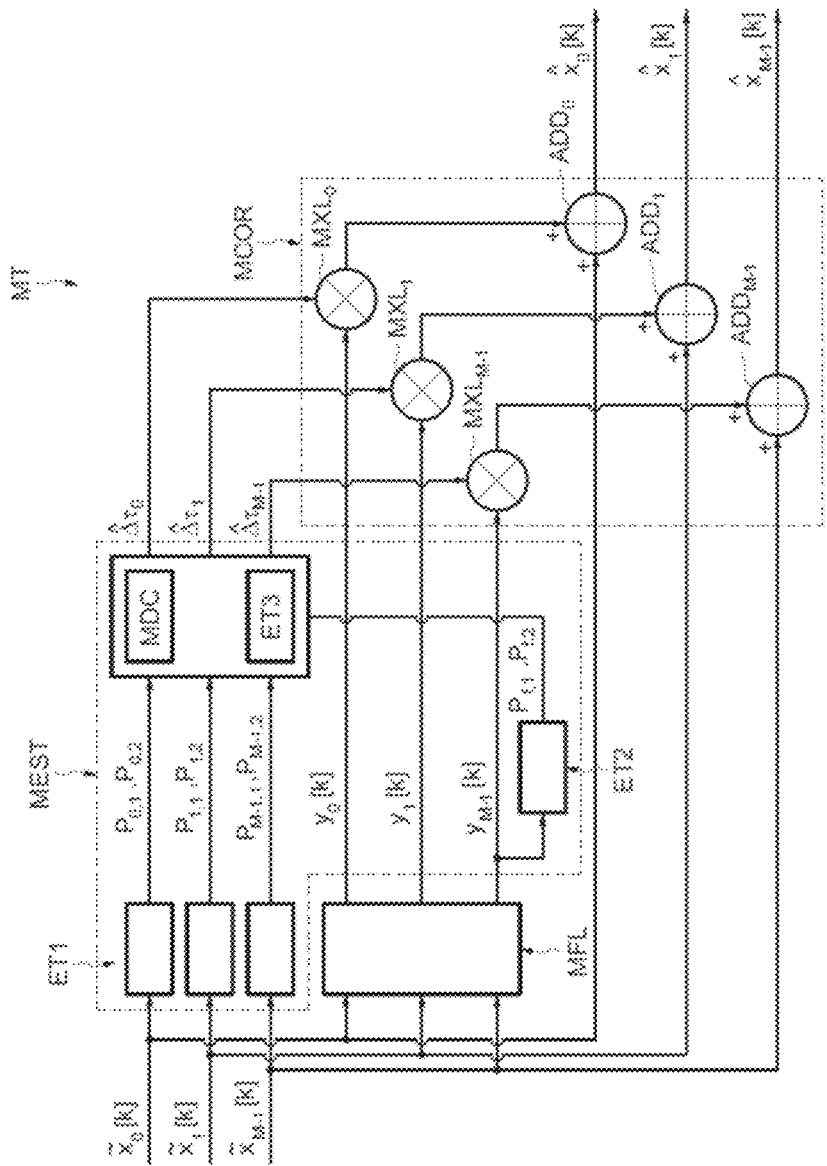

As shown in FIG. 4, the processor MT comprises filter MFL, which is configured to carry out a filtering process on the original trains $\tilde{x}_m[k]$, where m varies from 0 to M−1, in such a way as to deliver a filtered train of corresponding filtered samples $y_m[k]$.

These filter MFL has a transfer function substantially equal to the product of the transfer function of a reference low-pass filter and the transfer function of a derivative filter multiplied by the reference time constant $\tau_{ref}$ of the reference low-pass filter.

As is well known by those skilled in the art, a first order low-pass filter can be represented by a capacitive-resistive network. Knowing the hardware structure of each of the M an analog-to-digital converters $ADC_m$, it is therefore possible, notably by simulation, to determine the statistical distribution of the time constants $\tau_m$ of the first order low-pass filters associated with these converters.

Even though it is possible to take an arbitrary value for the reference time constant $\tau_{ref}$, it is preferable, in order to minimize the degradation of the corrected sampled signal, to choose a value substantially equal to the average of the distribution of the time constants obtained by simulation as the reference time constant $\tau_{ref}$.

The processor MT also comprises an estimator MEST, which is configured to carry out an estimation process delivering an estimated difference $\hat{\Delta}\tau_m$ between the time constant $\tau_m$ of the first order low-pass filter associated with the corresponding converter $ADC_m$ and the reference time constant $\tau_{ref}$.

This estimated difference is in this case the estimation of the relative or normalized difference:

$$\frac{\tau_m - \tau_{ref}}{\tau_{ref}}$$

As will be seen in more detail below, this estimation processing comprises a first generation of a first item of differentiated power information $P_{m,1}$, $P_{m,2}$ relative to each original train $\tilde{x}_m[k]$.

The estimation processing comprises moreover a second generation of a second item of differentiated power information $P_{f,1}$, $P_{f,2}$ relative to at least one of the M filtered trains $y_m(k)$.

In the example described, the filtered train used is the train $y_{M-1}[k]$. This being so, it would have been entirely possible to use any one of these filtered trains. It would also have been possible to use some or all of the filtered trains for determining this second differentiated power information, for example by averaging the power indications $P_{f,1}$, $P_{f,2}$ associated with some or all of the filtered trains. However, it was chosen to use only one single filtered train for reasons of simplification and of space requirement.

As will be seen in more detail below, the concept of "differentiated" power information signifies that this differentiated power information in fact comprises two different power indications associated with the same train, which will make it possible to eliminate the static gain of the corresponding converter in the calculation of $\hat{\Delta}\tau_m$.

The processor MT comprises moreover a correction circuit MCOR comprising, as will be seen below, multipliers and adders configured to carry out a process of correction of the original samples $\tilde{x}_m[k]$ so as to deliver a corrected train of corresponding corrected samples $\hat{x}_m[k]$ This correction processing uses the filtered samples of the corresponding filtered train $y_m[k]$ and the corresponding estimated difference $\hat{\Delta}\tau_m$.

Moreover, as mentioned above, the M corrected trains are then considered as having come from the corresponding M converters, the first order low-pass filters of which $FPB_m$ all have the reference time constant $\tau_{ref}$ as their time constant.

A compensation of the bandwidth mismatch of the different analog-to-digital converters $ADC_m$ has therefore been carried out here. The term "compensation" should of course be understood to be a compensation that is not necessarily perfect because, in practice, the correction can result in low-pass filters all having the reference time constant to within an estimation error.

As long as the differences $\hat{\Delta}\tau_m$ have not been estimated, the samples are for example corrected with zero values.

Similarly, the estimation can be carried out just once, the set of differences $\hat{\Delta}\tau_m$ then remaining valid throughout the period of operation of the device.

However, the estimation can be repeated several times in order to update the set of differences $\hat{\Delta}\tau_m$ in order to take account notably of the variation of operating temperature for example.

Reference will now be made more particularly to FIGS. 5 to 9 in order to describe some of the constituent portions of the processor MT in more detail.

The filter MFL comprises a filter, the transfer function of which is close to that defined by the formula (2):

$$\frac{j\omega\tau_{ref}}{1 + j\omega\tau_{ref}} \qquad (2)$$

Figure 5:
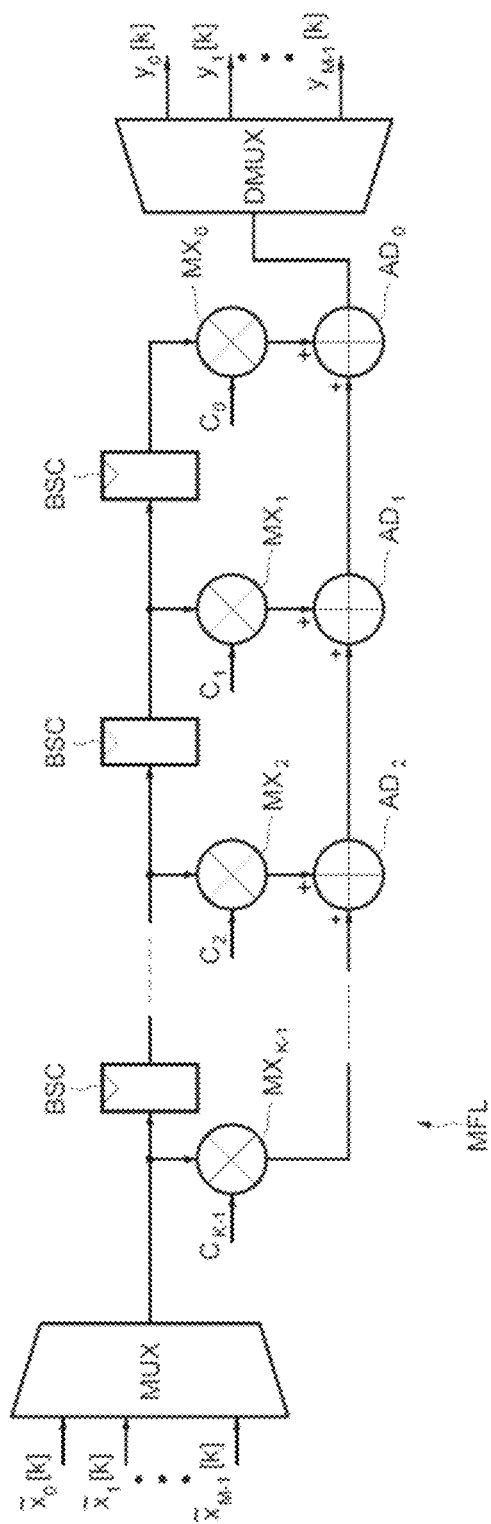

This filter is produced, in the example described in FIG. 5 by a finite impulse response filter having K coefficients $c_0$-$c_{K-1}$. This filter is of conventional and known structure and comprises a set of flip-flops BSC for delaying the signal and multipliers $MX_k$ and adders $AD_k$. The filter MFL receives the original trains $\hat{x}_m[k]$ on its input and delivers the filtered trains $y_m[k]$.

In the example described here, the original trains of samples arrive in parallel and are "serialized" by a multiplexer MUX (M samples of the sampled signal respectively coming from the M successive converters).

The filtered samples are then "re-parallelized" in a demultiplexer DMUX so as to deliver the M filtered trains of filtered samples.

This embodiment using a serializing of the original samples of the different original trains and then a re-parallelizing of the filtered trains is only one possible example of embodiment. In fact, it would be entirely possible to envisage carrying out the filtering processing in a parallel manner.

The frequency response $C(\omega)$ of this filter FIR, corresponding to the transfer function defined below by the formula (4), can then be expressed by the following formula (3):

$$C(\omega) = \sum_{k=0}^{K=1} c_k e^{-j\omega k} \qquad (3)$$

By way of non-limiting example, for a reference time constant $\tau_{ref}$ value equal to 0.45/Fs, it is possible to use a filter FIR having 17 coefficients (K=17), the values of which are given in an appendix.

If FIG. 4 is again referred to, it can be seen that the estimator MEST comprises, in this example of embodiment, a first stage ET1, a second stage ET2 and a block BLC comprising a third stage ET3 and a calculating module MDC.

FIGS. 6 to 9 will now be referred to more particularly in order to describe these different stages and this module in more detail.

Figure 6:
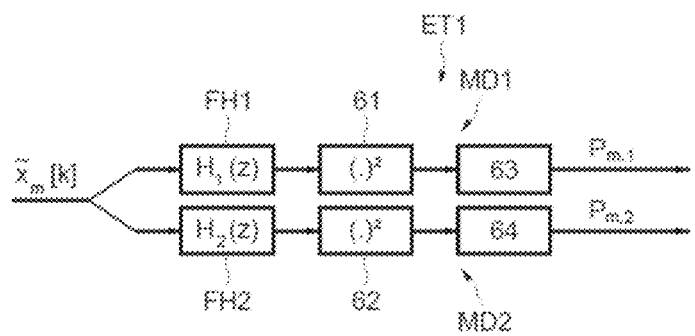
Figure 7:
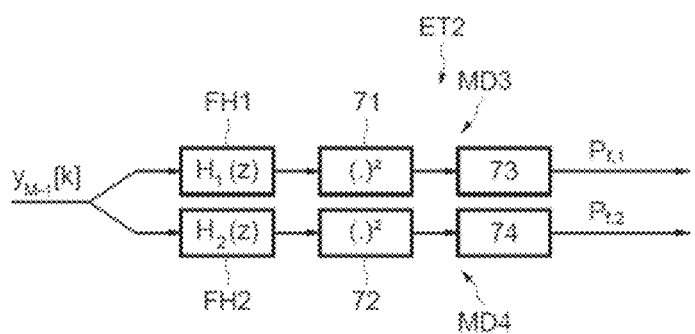

If FIG. 6 is referred to more particularly, it can be seen that the first stage ET1 comprises a first filter FH1 intended to filter each original train $\tilde{x}_m[k]$ and a first module MD1 configured to determine a first power indication $P_{m,1}$ of the original train $\tilde{x}_m[k]$ filtered by the first filter FH1.

The first stage ET1 also comprises a second filter FH2, different from the first filter FH1, intended to filter each original train $\tilde{x}_m[k]$ and a second module MD2 configured to determine a second power indication $P_{m,2}$ of the original train $\tilde{x}_m[k]$ filtered by the second filter FH2. These two power indications $P_{m,1}$ and $P_{m,2}$ form, as mentioned above, the first item of differentiated power information.

Several embodiments are of course possible. Thus, either provision is made for processing the original samples in parallel and consequently M assemblies similar to the one shown in FIG. 6 are used, or the trains of original samples are serialized and they are processed in a single assembly such as the one shown in FIG. 6 before "re-parallelizing" the corresponding items of differentiated power information.

Even though it is possible to use any two filters FH1, FH2, insofar as they are different, that is to say that they have different transfer functions, it is preferable that the transfer functions of these filters should have as few zeros as possible.

Thus, by way of indication, it will be possible to choose the following transfer function $H_1$ for the filter FH1:

$$H_1(z) = z + z^{-1} \quad (4)$$

and the following transfer function $H_2(z)$ for the filter FH2:

$$H_2(z) = z - z^{-1} \quad (5)$$

The first module MD1 comprises moreover a block 61 configured to square the value of each sample, that is to say, to determine its power.

The module MD1 comprises moreover a block 63 intended to calculate, over L samples, the average power of the train so as to deliver the power indication $P_{m,1}$.

This power indication $P_{m,1}$ is therefore an average power indication in this case.

The average calculation carried out in the block 63 can be of any type, for example a conventional average or a moving average. Moreover, the number L can for example be of the order of 1 million.

The structure of the block 62 and of the block 64 of the second module MD2 connected downstream of the filter FH2 is similar to that of the blocks 61 and 63.

The power indication $P_{m,2}$ delivered by the second module MD2 is therefore also an average power indication in this case.

The second stage ET2 (FIG. 7) has a structure similar to that of the first stage ET1.

More precisely, the filtered train $y_{M-1}^{[k]}$ is filtered by the two filters FH1 and FH2 and the modules MD3 and MD4 comprising the blocks 71, 73 and 72, 74, deliver the second item of differentiated power information comprising a third power indication $P_{f,1}$ and a fourth power indication $P_{f,2}$.

These different power indications $P_{f,1}$, $P_{m,2}$, $P_{f,1}$, $P_{f,2}$ will be used in the block BLC of the estimator MEST for determining, for each original train $\tilde{x}_m[k]$, the estimated time constant difference $\hat{\Delta\tau}_m$.

Figure 8:
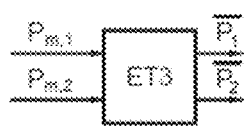
Figure 9:
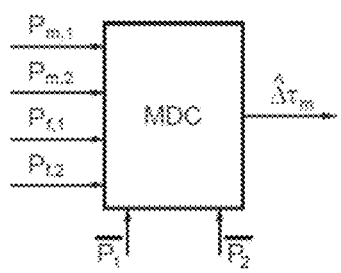

More precisely, as shown in FIG. 8, the third stage ET3 determines a first averaged power indication $\overline{P}_1$ obtained by an average of the M first power indications $P_{m,1}$. More precisely, $\overline{P}_1$ is defined by the following formula (6):

$$\overline{P}_1 = \frac{1}{M} \sum_{m=0}^{M-1} P_{m,1} \quad (6)$$

Similarly, the third stage ET3 generates a second averaged power indication $\overline{P}_2$ obtained by an average of the M second power indications $P_{m,2}$.

More precisely, $\overline{P}_2$ is defined by the following formula:

$$\overline{P}_2 = \frac{1}{M} \sum_{m=0}^{M-1} P_{m,2} \quad (7)$$

The calculating module MDC then determines (FIG. 9) the estimated difference $\hat{\Delta\tau}_m$ by the following formula (8):

$$\hat{\Delta\tau}_m = 2 \frac{P_{m,1} \overline{P}_2 - P_{m,2} \overline{P}_1}{P_{m,1} P_{f,2} - P_{m,2} P_{f,1}} \quad (8)$$

The fact that the power indications $P_{m,1}$ and $P_{m,2}$ as well as the power indications $P_{f,2}$ and $P_{f,1}$ were obtained by two filters having different transfer functions makes it possible for the estimation $\hat{\Delta\tau}_m$ not to be interfered with by the static gain of the converter $ADC_m$.

Similarly, the use of the power indications $P_{f,2}$ and $P_{f,1}$ makes it possible to calculate this estimated difference $\hat{\Delta\tau}_m$ in a single iteration.

If FIG. 4 is now referred to again, it can be seen that the correction circuit MCOR comprises M multipliers $MXL_0$-$MXL_{M-1}$ respectively intended to multiply the filtered samples $y_m[k]$ of the M filtered trains by the corresponding M estimated differences $\hat{\Delta\tau}_m$. The correction circuit MCOR comprises both to sleep him moreover M adders $ADD_0$-$ADD_{M-1}$ intended to add to the M original samples $\tilde{x}_m[k]$ the outputs of the M multipliers $MXL_0$-$MXL_{M-1}$ so as to obtain the M trains of corrected samples $\hat{x}_m[k]$.

Figure 10:
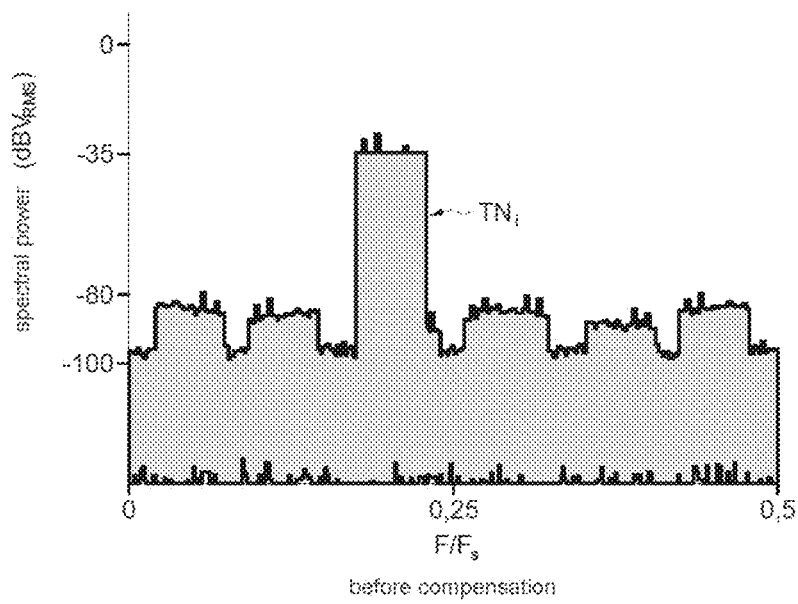
Figure 11:
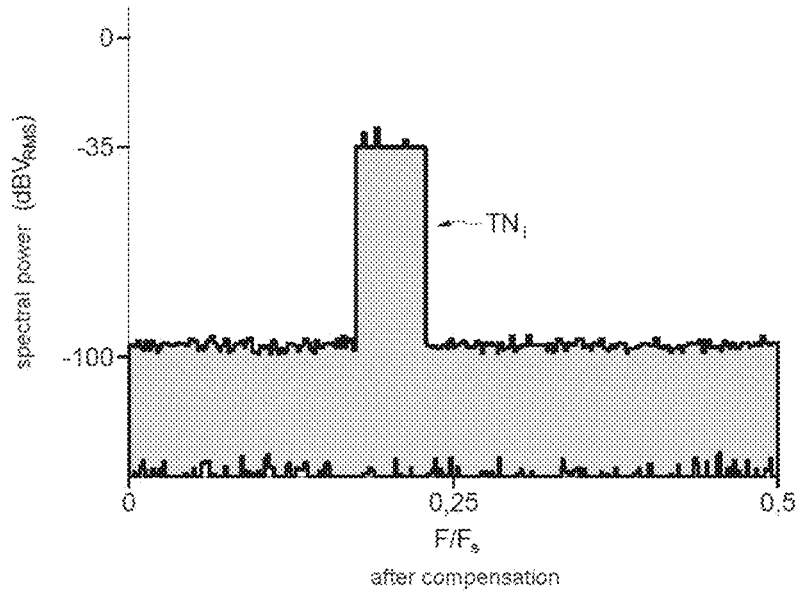

In each of the FIGS. 10 and 11, the vertical axis represents the spectral power of the sampled signal and the horizontal axis represents the normalized frequency F/Fs where F denotes the frequency of the sampled signal.

The input signal is a multi-tone signal having several useful tones $TN_i$.

It can be seen that, before compensation, the sampled signal delivered by the converters has parasitic frequency bands in addition to these tones $TN_i$ (FIG. 10).

After compensation by the device DIS, these parasitic bands have been eliminated (FIG. 11).

It has been seen above that the converters could have mismatches of various types such as for example timing skew mismatches, and also different static gains or different offsets.

The French patent application No. 1 351 447 describes an example of compensation of the offset mismatch.

The French patent application No. 1 351 445 describes an example of compensation of the gain mismatch.

The French patent application No. 1 351 448 describes an example of the timing skew mismatch.

The processor MT of the device DIS that has just been described can easily be incorporated in such a correction system.

Thus, by way of example, it would be possible firstly to compensate for the offsets, then to compensate for the bandwidth mismatch, then to compensate for the static gain mismatch and then, finally, to compensate for the timing skew mismatch.

APPENDIX

| Coefficients | Values |
| --- | --- |
| $c_0$ | −0.019029 |
| $c_1$ | 0.02163 |
| $c_2$ | −0.025054 |
| $c_3$ | 0.029765 |
| $c_4$ | −0.03666 |
| $c_5$ | 0.047716 |
| $c_6$ | −0.068342 |
| $c_7$ | 0.12071 |
| $c_8$ | 0.24582 |

APPENDIX-continued

| Coefficients | Values |
| --- | --- |
| $c_9$ | −0.37309 |
| $c_{10}$ | 0.082692 |
| $c_{11}$ | −0.059307 |
| $c_{12}$ | 0.042853 |
| $c_{13}$ | −0.033762 |
| $c_{14}$ | 0.027831 |
| $c_{15}$ | −0.023672 |
| $c_{16}$ | 0.020593 |

The invention claimed is:

1. A method of direct compensation of bandwidth mismatch, the method comprising:
receiving M original trains of M original samples from of M time-interleaved converters, M being greater than two, each converter being considered in the first order as comprising a first order low-pass filter;
digitally filtering the M original trains delivering M corresponding filtered trains of filtered samples, the filtering having a transfer function substantially equal to the product of a transfer function of a reference low-pass filter and a transfer function of a derivative filter multiplied by a reference time constant of the reference low-pass filter; and
for each original train of original samples,
performing an estimation process to deliver an estimated difference between the time constant of the first order low-pass filter associated with the corresponding converter and the reference time constant, the estimation process comprising a first generation of a first item of differentiated power information relative to the original train and a second generation of a second item of information of differentiated power relative to at least one of the M filtered trains, and
performing a correction process of the original samples of the original train using the filtered samples of the corresponding filtered train and the corresponding estimated difference, in such a way as to deliver a corrected train of corrected samples.

2. The method according to claim 1, wherein the M corrected trains are considered as coming from the corresponding M converters, the first order low-pass filters of which all have the reference time constant as their time constant.

3. The method according to claim 1, wherein digitally filtering the M original trains comprises filtering each original train of original samples by a filter having a transfer function of that is substantially equal to $j\omega\tau_{ref}/(1+j\omega\tau_{ref})$, where $\tau_{ref}$ denotes the time constant of the first order reference low-pass filter.

4. The method according to claim 1, wherein the first generation comprises a first filtering of the corresponding original train with a first filter any determination of a first indication of power of the original train filtered by this first filter, and a second filtering of the corresponding original train with a second filter, which is different from the first filter, and a determination of a second indication of power of the original train filtered by this second filter, the first differentiated power information comprising the first and second power indications.

5. The method according to claim 4, wherein the second generation comprises a third filtering of the at least one of the M trains filtered with the first filter and a determination of a third indication of power of the at least one of the M filtered trains filtered by this first filter, and a fourth filtering of the at least one of the M trains filtered with the second filter and a determination of a fourth indication of power of the at least one of the M filtered trains filtered by this second filter, the second differentiated power information comprising the third and fourth power indications.

6. The method according to claim 5, wherein the estimation process further comprises a determination of a first averaged power indication obtained by an average of the M first power indications and a determination of a second averaged power indication obtained by average of the M second power indications, and the estimated difference is obtained for the corresponding original train from the first corresponding power indication, from the second corresponding power indication, from the third power indication, from the fourth power indication, from the first averaged power indication and from the second averaged power indication.

7. The method according to claim 1, wherein the correction process comprises, for each original train, an addition to each original sample of the product of the homologous filtered sample of the filtered train corresponding to this original train and the corresponding estimated difference.

8. A device for direct compensation of bandwidth mismatch of M time-interleaved converters, M being greater than two, each converter being considered in the first order as comprising a first order low-pass filter, the device comprising:
an input to receive M original trains of original samples respectively coming from the M converters;
an output to deliver M corrected trains of corrected samples;
a processor comprising:
a digital filter configured to carry out a filtering process on the M original trains in such a way as to deliver M corresponding filtered trains of filtered samples, the filter having a transfer function substantially equal to the product of a transfer function of a reference low-pass filter and a transfer function of a derivative filter multiplied by a reference time constant of the reference low-pass filter;
an estimator configured to carry out an estimation process delivering, for each original train, an estimated difference between a time constant of the first order low-pass filter associated with the corresponding converter and the reference time constant, and comprising a first generation of a first item of differentiated power information relative to each original train and a second generation of a second item of differentiated power information relative to at least one of the M filtered trains; and
a correction circuit configured to carry out a process of correction of the original samples of each original train using the filtered samples of the corresponding filtered trains and the corresponding estimated difference, in such a way as to deliver a corresponding corrected train of corrected samples.

9. The device according to claim 8, wherein the M corrected trains are considered as having come from the corresponding M converters, the first order low-pass filters of which all have the reference time constant as their time constant.

10. The device according to claim 8, wherein the filter comprises a filter whose transfer function is substantially equal to $j\omega\tau_{ref}/(1+j\omega\tau_{ref})$, where $\tau_{ref}$ denotes the time constant of the reference first order low-pass filter.

11. The device according to claim 10, wherein the filter comprises a finite impulse response filter.

12. The device according to claim 8, wherein the estimator comprises:
a first stage comprising a first filter intended to filter the corresponding original train and a first module configured to determine a first power indication of the original train filtered by the first filter, and a second filter, different from the first filter, intended to filter the corresponding original train and a second module configured to determine a second power indication of the original train filtered by the second filter, the first differentiated power information comprising the first and second power indications; and
a second stage comprising the first filter intended to filter the at least one of the M filtered trains and a third module configured to determine a third power indication of the at least one of the M filtered trains filtered by the first filter, and the second filter intended to filter the at least one of the M filtered trains and a fourth module configured to determine a fourth power indication of the at least one of the M filtered trains filtered by this second filter, the second differentiated power information comprising the third and fourth power indications.

13. The device according to claim 12, wherein the estimator comprises a third stage configured to determine a first averaged power indication obtained by an average of the M first power indications and a second averaged power indication obtained by an average of the M second power indications, and a calculate module configured to calculate the estimated difference for the corresponding original train, from the corresponding first power indication, from the second corresponding power indication, from the third power indication, from the fourth power indication, from the first averaged power indication and from the second averaged power indication.

14. The device according to claim 8, wherein the correction circuit is configured, for each original train, to add to each original sample the product of a homologous filtered sample of the filtered train corresponding to this original train and the corresponding estimated difference.

15. An integrated circuit comprising a device according claim 8.

16. An integrated circuit comprising:
M time-interleaved converters, M being greater than two, wherein each converter is considered in the first order as comprising a first order low-pass filter, the converters providing M original trains of original samples; and
a processor comprising:
a digital filter configured to carry out a filtering process on the M original trains in such a way as to deliver M corresponding filtered trains of filtered samples, the filter having a transfer function substantially equal to the product of a transfer function of a reference low-pass filter and a transfer function of a derivative filter multiplied by a reference time constant of the reference low-pass filter;
an estimator configured to carry out an estimation process delivering, for each original train, an estimated difference between the time constant of the first order low-pass filter associated with the corresponding converter and the reference time constant, and comprising a first generation of a first item of differentiated power information relative to each original train and a second generation of a second item of differentiated power information relative to at least one of the M filtered trains; and
a correction circuit configured to carry out a process of correction of the original samples of each original train using the filtered samples of the corresponding filtered trains and the corresponding estimated difference, in such a way as to deliver a corresponding corrected train of corrected samples.

17. The integrated circuit according to claim 16, wherein the filter comprises a filter whose transfer function is substantially equal to $j\omega\tau ref/(1+j\omega\tau ref)$, where $\tau ref$ denotes the time constant of the reference first order low-pass filter.

18. The integrated circuit according to claim 17, wherein the filter comprises a finite impulse response filter.

19. The integrated circuit according to claim 16, wherein the estimator comprises:
a first stage comprising a first filter intended to filter the corresponding original train and a first module configured to determine a first power indication of the original train filtered by the first filter, and a second filter, different from the first filter, intended to filter the corresponding original train and a second module configured to determine a second power indication of the original train filtered by the second filter, the first differentiated power information comprising the first and second power indications; and
a second stage comprising the first filter intended to filter the at least one of the M filtered trains and a third module configured to determine a third power indication of the at least one of the M filtered trains filtered by the first filter, and the second filter intended to filter the at least one of the M filtered trains and a fourth module configured to determine a fourth power indication of the at least one of the M filtered trains filtered by this second filter, the second differentiated power information comprising the third and fourth power indications.

20. The integrated circuit according to claim 16, wherein the correction circuit is configured, for each original train, to add to each original sample the product of the homologous filtered sample of the filtered train corresponding to this original train and the corresponding estimated difference.

* * * * *